United States Patent
Tan et al.

[11] Patent Number: 5,358,824
[45] Date of Patent: Oct. 25, 1994

[54] PHOTOSENSITIVE RESIN COMPOSITION UTILIZING 1,2-NAPHTHOQUINONE DIAZIDE COMPOUND HAVING SPIROBICHROMAN OR SPIROBIINDANE RING

[75] Inventors: Shiro Tan; Yasunori Takata; Yoshimasa Aotani; Fumiyuki Nishiyama, all of Shizuoka, Japan

[73] Assignee: Fuji Photo Film Co., Ltd., Kanagawa, Japan

[21] Appl. No.: 118,590

[22] Filed: Sep. 10, 1993

[30] Foreign Application Priority Data

Sep. 11, 1992 [JP] Japan .................. 4-243093

[51] Int. Cl.$^5$ ............................ G03F 7/023
[52] U.S. Cl. .................... 430/192; 430/165; 430/193; 534/556; 534/557; 549/330; 549/331; 549/333; 549/334
[58] Field of Search ............ 430/192, 193, 165; 534/556, 557; 549/330, 331, 333, 334

[56] References Cited

U.S. PATENT DOCUMENTS 4,883,739 11/1989 Sakaguchi et al. ............ 430/192

Primary Examiner—Charles L. Bowers, Jr.
Assistant Examiner—Christopher G. Young
Attorney, Agent, or Firm—Sughrue, Mion, Zinn, Macpeak & Seas

[57] ABSTRACT

The photosensitive resin composition of the present invention comprises an admixture of 5 to 100 weight parts of a photosensitive material having the following general formula (A) and 100 weight parts of an alkali-soluble resin:

General formula (A)

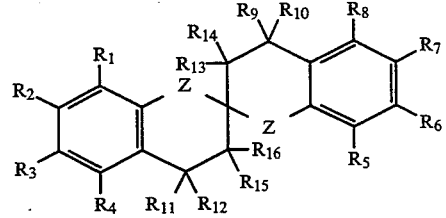

where $R_1$ to $R_8$ each independently represents a hydrogen atom, a hydroxyl group, a halogen atom, an alkyl group, an alkoxyl group, an aralkyl group, an aryl group, an amino group, a monoalkylamino group, a dialkylamino group, an acylamino group, an alkylcarbamoyl group, an arylcarbamoyl group, an alkylsulfamoyl group, an arylsulfamoyl group, a carboxyl group, a cyano group, a nitro group, an acyl group, an alkyloxycarbonyl group, an aryloxycarbonyl group, an acyloxy group, or —OD, —N(R)—D (where R represents a hydrogen atom or an alkyl group, and D represents a 1,2-napthoquinoediazide-5-sulfonyl group or a 1,2-napthoquinoediazide-4-sulfonyl group), and at least one of $R_1$ to $R_8$ represents —OD or —N(R)—D; $R_9$ to $R_{12}$ each independently represents a hydrogen atom, a lower alkyl group, or $R_9$ and $R_{10}$ and/or $R_{11}$ and $R_{12}$ may form a ring; $R_{13}$ to $R_{14}$ each independently represents a hydrogen atom, a lower alkyl group, or $R_{13}$ or $R_{14}$ and any of $R_{15}$ or $R_{16}$ may form a ring, whereas at least one of $R_{13}$ to $R_{16}$ is a substitution group other than hydrogen; and Z represents an oxygen atom or a single bond.

1 Claim, No Drawings

PHOTOSENSITIVE RESIN COMPOSITION UTILIZING 1,2-NAPHTHOQUINONE DIAZIDE COMPOUND HAVING SPIROBICHROMAN OR SPIROBIINDANE RING

BACKGROUND OF THE INVENTION

The present invention relates to a photosensitive resin composition, which comprises an alkali-soluble resin and specific type of photosensitive material and is sensitive to radiation ray such as ultraviolet ray, far ultraviolet ray, X-ray, electron beam, molecular beam, γ-ray, synchrotron radiation ray, etc. Above all, the present invention relates to a photoresist, and in particular to a photoresist composition used for fine fabrication purpose and provided with high resolution and sensitivity, good preservation stability and having pattern of vertical shape.

The photoresist according to the present invention is coated on a semiconductor wafer or a substrate such as glass, ceramics, metal, etc. by spin coating method or roller coating method in thickness of 0.5 to 3 μm. Then, it is heated and dried, and circuit pattern is printed through exposure mask by ultraviolet ray irradiation, and a positive image is obtained by development. Further, by etching this positive image as mask, it is possible to produce a pattern on the substrate. Typical applications include semiconductor manufacturing process of semiconductor such as IC, manufacture of circuit substrate such as liquid crystal or thermal head, and further, the other photo-fabrication process.

As the positive type photoresist compositions, compositions containing alkali-soluble resin and naphthoquinonediazide compound as photosensitive material is generally used. For example, "novolak type phenol resin/naphquinoneazide substitution compound" is disclosed in U.S. Pat. Nos. 3,666,473, 4,115,128, and 4,173,470, etc. Also, as the most typical composition, "novolak resin consisting of cresol-formaldehyde/trihydroxybenzophenone-1,2-naphthoquinonediazide sulfonic acid ester" is described in: L. F. Thompson: "Introduction to Microlithography" (ACS Publication, No. 2, 19, p. 112-121).

Novolak resin used as bonding agent is soluble in alkali aqueous solution without being swollen, and it is particularly useful for this purpose because it shows high resistance to plasma etching in case an image generated is used as a mask for etching. Naphthoquinonediazide compound used as photosensitive material acts by itself as a dissolution inhibitor to reduce alkali solubility of novolak resin. It has specific feature in that, when decomposed under light irradiation, it generates alkali-soluble substance and rather enhances alkali solubility of novolak resin. Because of such extensive property changes to light, it is particularly useful as a photosensitive material of positive type photoresist.

Under such circumstances, a wide variety of positive type photoresist containing novolak resin and naphquinoneazide type photosensitive material has been developed and used in practical application, and sufficient results have been attained in fabrication of linewidth up to 1.5 to 2 μm.

However, integrated circuits with increasingly higher integration is now being produced, and it is necessary to fabricate ultra-fine pattern with linewidth of 1 μm or less in the manufacturing process of semiconductor substrate such as ultra-LSI. In such applications, there are strong demands on a photoresist, which has high resolution, high reproducing accuracy of pattern for precisely transferring pattern of exposure mask, high sensitivity from viewpoint of high productivity, and excellent preservation stability.

In order to attain high resolution, it has been attempted to increase content of quinone-diazide photosensitive group. For example, Japanese Patent Publication Laid-Open 60-158440 describes a method using a photosensitive material containing high triester content. Also, Japanese Patent Publication 61-118744 discloses an attempt to increase the number of quinonediazide photosensitive group contained in a molecule of photosensitive material.

However, some of these photosensitive materials are insoluble in solvents commonly used, or, even when dissolved, deposition occurs during storage of photoresist composition, and this causes troubles in photo-fabrication process or device manufacturing process and reduces yield. To prevent the deposition of photosensitive material, Japanese Patent Publication Laid-Open 61-260239 describes a method to add an organic solvent with solubility parameter of 11 to 12. However, since solvents such as dimethylsulfoxide are used, the resist compositions have poor preservation stability, and sensitivity and resolution are subject to extensive changes as time elapses.

On the other hand, Japanese Patent Publication Laid-Open 64-76047 discloses 1,2-naphthoquinonediazide sulfonic acid ester of specific type of spirobiindan compound or spirobichroman compound as a photoresist with long-term preservation stability.

However, when the photosensitive materials with specific structure are used as photoresist, cross-section of pattern is not satisfactorily rectangular, and further modifications are needed.

As described above, conventional types of photoresist cannot meet the requirements for practical use.

To solve the above problems, it is an object of the present invention to provide a photoresist composition for manufacture of semiconductor device, such as:

(1) a photoresist composition having high resolution;
(2) a photoresist composition for accurately reproducing mask dimension over wide range of photomask linewidth;
(3) a photoresist composition capable to generate resist pattern with cross-sectional shape having high aspect ratio in linewidth pattern of 1 μm or less;
(4) a photoresist composition having wide development latitude;
(5) a photoresist composition soluble in resist solvent commonly used and with excellent preservation stability without generating foreign objects even when stored for long time;
(6) a photoresist composition for producing heat-resistant resist image; and
(7) a photoresist composition for generating pattern with cross-section closer to rectangle.

SUMMARY OF THE INVENTION

After elaborately studying with special care on the above points, the present inventors have completed the invention.

Specifically, the present invention provides a photosensitive resin component, comprising a photosensitive material by 5 to 100 weight parts and an alkali-soluble resin by 100 weight parts, said photosensitive material having a structure given by the following general formula:

General formula (A)

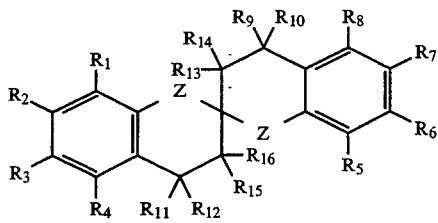

where $R_1$ to $R_8$ each independently represents hydrogen, hydroxyl group, halogen, alkyl group, alcoxyl group, aralkyl group, aryl group, amino group, monoalkylamino group, dialkylamino group, acylamino group, alkylcarbamoyl group, arylcarbamoyl group, alkylsulfamoyl group, arylsulfamoyl group, carboxyl group, cyano group, nitro group, acyl group, alkyloxycarbonyl group, aryloxycarbonyl group, acyloxy group, or —OD, —N(R)—D (where R represents hydrogen or alkyl group, and D represents 1,2-naphthoquinonediazide-5-sulfonyl group or 1,2-naphthoquinonediazide-4-surfonyl group), and at least one of $R_1$ to $R_8$ represents —OD or —N(R)—D;

$R_9$ to $R_{12}$ each independently represents hydrogen, lower alkyl group, or $R_9$ and $R_{10}$ and/or $R_{11}$ and $R_{12}$ may form a ring;

$R_{13}$ to $R_{16}$ each independently represents hydrogen, lower alkyl group, or $R_{13}$ or $R_{14}$, and $R_{15}$ or $R_{16}$ may form a ring. However, at least one of $R_{13}$ to $R_{16}$ is a substitution group other than hydrogen; and Z represents oxygen or a single bond.

As already described, Japanese Patent Publication Laid-Open 64-76047 discloses 1,2-naphthoquinonediazide sulfonic acid ester of spirobiindan or spirobichroman compound having similar structure. These compounds have high preservation stability, but there have been demands on further modification to provide rectangular cross-section of pattern. The present inventors took special note on position 2 substitution group of spirobiindan and position 3 substitution group of spirobichroman and have elaborately studied and finally found that rectangular pattern can be obtained by making at least one of them a substitution group other than hydrogen.

The photosensitive resin composition of the present invention has higher solution, high reproducibility and is superior in development latitude, sensitivity, heat-resistance and preservation property and can provide a pattern with cross-section closer to rectangle.

DESCRIPTION OF THE PREFERRED EMBODIMENT

In the general formula (A) to express the photosensitive material of the present invention, the halogen represented by $R_1$ to $R_8$ is preferably chlorine, bromine or iodine, the alkyl group represented by $R_1$ to $R_8$ is preferably an alkyl group having 1 to 4 carbon atoms such as methyl, ethyl, propyl, isopropyl, n-butyl, isobutyl, sec-butyl, t-butyl; the alcoxyl group is preferably an alcoxyl group having 1 to 4 carbon atoms such as methoxy, ethoxy, hydroxyethoxy, propoxy, hydroxypropoxy, isopropoxy, n-butoxy, isobutoxy, sec-butoxy, or t-butoxy; the aralkyl group is preferably benzyl group, phenetyl group, benzhydryl group, etc.; the aryl group is preferably phenyl, tolyl, hydroxyphenyl, naphthyl, etc.; the monoalkylamino group is preferably a monoalkylamino group having 1 to 4 carbon atoms such as monomethylamino, monoethylamino, monopropylamino, monoisopropylamino, mono-n-butylamino, monoisobutylamino, mono-sec-butylamino, or mono-t-butylamino; the dialkylamino group is preferably a dialkylamino group having alkyl substitution group with 1 to 4 carbon atoms such as dimethylamino, diethylamino, dipropylamino, diisopropylamino, di-n-butylamino, diisobutylamino, di-sec-butylamino, di-t-butylamino, etc.; the acylamino group is preferably an aliphatic substitution acylamino group having 2 to 5 carbon atoms respectively such as acetylamino, propionylamino, butyrylamino, isobutyrylamino, isovalerylamino, pivaloylamino, and an aromatic substitution acylamino group such as benzoylamino, or toluoylamino; the alkylcarbamoyl group is preferably an alkylcarbamoyl group having 2 to 5 carbon atoms such as methylcarbamoyl, ethylcarbamoyl, propylcarbamoyl, isopropylcarbamoyl, n-butylcarbamoyl, isobutylcarbamoyl, sec-butylcarbamoyl, t-butylcarbamoyl, etc.; the arylcarbamoyl group is preferably phenylcarbamoyl, tolylcarbamoyl, etc.; the alkylsulfamoyl group is preferably an alkylsulfamoyl group having 1 to 4 carbon atoms such as methylsulfamoyl, ethylsulfamoyl, propylsulfamoyl, isopropylsulfamoyl, n-butylsulfamoyl, sec-butylsulfamoyl, t-butylsulfamoyl, etc.; arylsulfamoyl group is preferably phenylsulfamoyl, tolylsulfamoyl, etc.; the acyl group is preferably an aliphatic acyl group having 1 to 5 carbon atoms such as formyl, acetyl, propionyl, butyryl, isobutyryl, valeryl, isovaleryl, pivaloyl, etc. and an aromatic acyl group such as benzoyl, toluoyl, salicyloyl, naphthaoyl, etc.; the alkyloxycarbonyl group is preferably an alkyloxycarbonyl group having 2 to 5 carbon atoms such as methoxycarbonyl, ethoxycarbonyl, propoxycarbonyl, isopropoxycarbonyl, n-butoxycarbonyl, isobutoxycarbonyl, sec-butoxycarbonyl, t-butoxycarbonyl, etc.; the aryloxycarbonyl group is preferably an aryloxycarbonyl group such as phenoxycarbonyl; the acyloxy group is preferably an aliphatic acyloxy group having 2 to 5 carbon atoms such as acetoxy, propionyloxy, butyryloxy, isobutyryloxy, valeryloxy, isovaleryloxy, pivaloyloxy, etc. and an aromatic acyloxy group such as benzoyloxy, toluoyloxy, naphthoyloxy, etc.

In the above general formula (A), the alkyl group represented by $R_9$ to $R_{12}$ is preferably an alkyl group having 1 to 4 carbon atoms such as methyl, ethyl, propyl, isopropyl, butyl, isobutyl, sec-butyl, t-butyl, etc.

The compound expressed by tile general formula (A) can be easily synthesized by condensing a derivative of spirobiindan or spirobichroman with 1,2-naphthoquinonediazide-5-sulfonyl chloride or 1,2-naphthoquinonediazide-4-sulfonyl chloride or mixture of these substances, whereby said derivative of spirobiindan or spirobichroman is expressed by:

General formula (B)

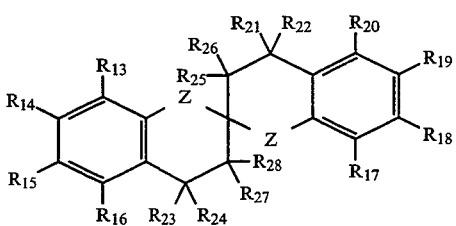

where $R_{13}$ to $R_{20}$ each independently rtepresents hydrogen, hydroxyl group, halogen, alkyl group, alcoxyl group, aralkyl group, aryl group, amino group, monoalkylamino group, dialkylamino group, acylamino group, alkylcarbamoyl group, arylcarbamoyl group, alkylsulfamoyl group, arylsulfamoyl group, carboxyl group, cyano group, nitro group, acyl group, alkyloxycarbonyl group, aryloxycarbonyl group, or acyloxy group, and at least one of $R_{13}$ to $R_{20}$ is hydroxyl group, amino group or monoalkylamino group;

$R_{21}$ to $R_{24}$ each independently represents hydrogen or lower alkyl group, and $R_{21}$ and $R_{22}$ and/or $R_{23}$ and $R_{24}$ may form a ring;

$R_{25}$ to $R_{28}$ each independently represents hydrogen or lower alkyl group, and $R_{25}$ or $R_{26}$ and $R_{27}$ or $R_{28}$ may form a ring. However, at least one of $R_{25}$ to $R_{28}$ is a substitution group other than hydrogen; and Z is oxygen or a single bond.

The compound expressed by the general formula (B) can be synthesized, for example, by applying the method of W. Baker et al. [J. Chem. Soc., (1939), p. 195 ff.] More concretely, the compound can be obtained by dehydrated condensation of substituted or unsubstituted (poly)hydroxyphenyl compound and carbonyl compounmd except acetone, e.g. methylethylketone, diethylketone, methylisobutylketone, cyclohexanone, etc. in the presence of acid catalyst. In the compound thus obtained, at least one substitution group other than hydrogen is introduced at position 2 or position 2' in case of spirobiindan compound, and at least one substitution group other than hydrogen is introduced at position 3 or position 3' in case of spirobichroman compound. Actually, a single product is not obtained by the introduced substitution group and substituting position isomer of hydroxyl group, but it is obtained as a mixture of many types of isomers.

The compounds expressed by the general formula (B) are summarized in Tables 1 to 7 but are not limited to these.

TABLE 1

| No. | Compounds |
|---|---|
| 1 | 2,3,3'-trimethyl-3,3'-diethyl-1,1'-spirobiindan-5,6-7,5',6',7'-hexol |
| 2 | 2,3,3'-trimethyl-3,3'-diethyl-1,1'-spirobiindan-4,5,6,4',5',6'-hexol |
| 3 | 2,3,3'-trimethyl-3,3'-diethyl-1,1'-spirobiindan-4,5,6,5',6',7'-hexol |
| 4 | 2,2'-dimethyl-3,3,3',3'-tetraethyl-1,1'-spirobiindan-5,6,7,5',6',7'-hexol |
| 5 | 2,2'-dimethyl-3,3,3',3'-tetraethyl-1,1'-spirobiindan-4,5,6,4',5',6'-hexol |
| 6 | 2,2'-dimethyl-3,3,3',3'-tetraethyl-1,1'-spirobiindan-4,5,6,5',6',7'-hexol |
| 7 | 2,2,3,3'-tetramethyl-3,3'-di-iso-propyl-1,1'-spirobiindan-5,6,7,5',6',7'-hexol |
| 8 | 2,2,3,3'-tetramethyl-3,3'-di-iso-propyl-1,1'-spirobiindan-4,5,6,4',5',6'-hexol |
| 9 | 2,2,3,3'-tetramethyl-3,3'-di-iso-propyl-1,1'-spirobiindan-4,5,6,5',6',7'-hexol |
| 10 | 2-ethyl-3,3'-dimethyl-3,3'-di-n-propyl-1,1'-spirobiindan-5,6,7,5',6',7'-hexol |
| 11 | 2-ethyl-3,3'-dimethyl-3,3'-di-n-propyl-1,1'-spirobiindan-4,5,6,4',5',6'-hexol |
| 12 | 2-ethyl-3,3'-dimethyl-3,3'-di-n-propyl-1,1'-spirobiindan-4,5,6,5',6',7'-hexol |

TABLE 2

| No. | Compounds |
|---|---|
| 13 | 2-n-propyl-3,3'-dimethyl-3,3'-di-n-buthyl-1,1'-spirobiindan-5,6,7,5',6',7'-hexol |
| 14 | 2-n-propyl-3,3'-dimethyl-3,3'-di-n-buthyl-1,1'-spirobiindan-4,5,6,4',5',6'-hexol |
| 15 | 2-n-propyl-3,3'-dimethyl-3,3'-di-n-buthyl-1,1'-spirobiindan-4,5,6,5',6',7'-hexol |
| 16 | 2-methyl-1,1'-spirobiindan-5,6,7,5',6',7'-hexol |
| 17 | 2-methyl-1,1'-spirobiindan-4,5,6,4',5',6'-hexol |
| 18 | 2-methyl-1,1'-spirobiindan-4,5,6,5',6',7'-hexol |
| 19 | 2-iso-propyl-3,3'-dimethyl-3,3'-di-iso-butyl-1,1'-spirobiindan-5,6,7,5',6',7'-hexol |
| 20 | 2-iso-propyl-3,3'-dimethyl-3,3'-di-iso-butyl-1,1'-spirobiindan-4,5,6,4',5',6'-hexol |
| 21 | 2-iso-propyl-3,3'-dimethyl-3,3'-di-iso-butyl-1,1'-spirobiindan-4,5,6,5',6',7'-hexol |
| 22 | 2,3,3'-trimethyl-3,3'-diethyl-1,1'-spirobiindan-4,5,4',5'-tetrol |
| 23 | 2,3,3'-trimethyl-3,3'-diethyl-1,1'-spirobiindan-4,5,5',6'-tetrol |
| 24 | 2,3,3'-trimethyl-3,3'-diethyl-1,1'-spirobiindan-4,5,6',7'-tetrol |
| 25 | 2,3,3'-trimethyl-3,3'-diethyl-1,1'-spirobiindan-5,6,5',6'-tetrol |

TABLE 3

| No. | Compounds |
|---|---|
| 26 | 2,3,3'-trimethyl-3,3'-diethyl-1,1'-spirobiindan-6,7,6',7'-tetrol |
| 27 | 2,3,3'-trimethyl-3,3'-diethyl-1,1'-spirobiindan-5,6,6',7'-tetrol |
| 28 | 2,3,3'-trimethyl-3,3'-diethyl-1,1'-spirobiindan-4,6,4',6'-tetrol |
| 29 | 2,3,3'-trimethyl-3,3'-diethyl-1,1'-spirobiindan-4,6,5',7'-tetrol |
| 30 | 2,3,3'-trimethyl-3,3'-diethyl-1,1'-spirobiindan-5,7,5',7'-tetrol |
| 31 | 2,3,3'-trimethyl-3,3'-diethyl-1,1'-spirobiindan-5,7,4',6'-tetrol |
| 32 | 2,2'-dimethyl-3,3,3',3'-tetraethyl-1,1'-spirobiindan-4,5,4',5'-tetrol |
| 33 | 2,2'-dimethyl-3,3,3',3'-tetraethyl-1,1'-spirobiindan-4,5,5',6'-tetrol |
| 34 | 2,2'-dimethyl-3,3,3',3'-tetraethyl-1,1'-spirobiindan-4,5,6',7'-tetrol |
| 35 | 2,2'-dimethyl-3,3,3',3'-tetraethyl-1,1'-spirobiindan-5,6,5',6'-tetrol |
| 36 | 2,2'-dimethyl-3,3,3',3'-tetraethyl-1,1'-spirobiindan-6,7,6',7'-tetrol |
| 37 | 2,2'-dimethyl-3,3,3',3'-tetraethyl-1,1'-spirobiindan-5,6,6',7'-tetrol |
| 38 | 2,2'-dimethyl-3,3,3',3'-tetraethyl-1,1'-spirobiindan-4,6,4',6'-tetrol |
| 39 | 2,2'-dimethyl-3,3,3',3'-tetraethyl-1,1'-spirobiindan-4,6,5',7'-tetrol |
| 40 | 2,2'-dimethyl-3,3,3',3'-tetraethyl-1,1'-spirobiindan-5,7,5',7'-tetrol |

TABLE 4

| No. | Compounds |
|---|---|
| 41 | 2,2,3,3'-tetramethyl-3,3'-di-iso-propyl-1,1'-spirobiindan-4,5,4',5'-tetrol |
| 42 | 2,2,3,3'-tetramethyl-3,3'-di-iso-propyl-1,1'-spirobiindan-4,5,5',6'-tetrol |
| 43 | 2,2,3,3'-tetramethyl-3,3'-di-iso-propyl-1,1'-spirobiindan-4,5,6',7'-tetrol |
| 44 | 2,2,3,3'-tetramethyl-3,3'-di-iso-propyl-1,1'-spirobiindan-5,6,5',6'-tetrol |
| 45 | 2,2,3,3'-tetramethyl-3,3'-di-iso-propyl-1,1'-spirobiindan-6,7,6',7'-tetrol |
| 46 | 2,2,3,3'-tetramethyl-3,3'-di-iso-propyl-1,1'-spirobiindan-5,6,6',7'-tetrol |
| 47 | 2,2,3,3'-tetramethyl-3,3'-di-iso-propyl-1,1'-spirobiindan-4,6,4',6'-tetrol |
| 48 | 2,2,3,3'-tetramethyl-3,3'-di-iso-propyl-1,1'-spirobiindan-4,6,5',7'-tetrol |
| 49 | 2,2,3,3'-tetramethyl-3,3'-di-iso-propyl-1,1'-spirobiindan-5,7,5',7'-tetrol |
| 50 | 2,2,3,3'-tetramethyl-3,3'-di-iso-propyl-1,1'- |

TABLE 4-continued

| No. | Compounds |
|---|---|
|  | spirobiindan-5,7,4',6'-tetrol |
| 51 | 2-ethyl-3,3'-dimethyl-3,3'-di-n-propyl-1,1'-spirobiindan-4,5,4',5'-tetrol |
| 52 | 2-ethyl-3,3'-dimethyl-3,3'-di-n-propyl-1,1'-spirobiindan-4,5,5',6'-tetrol |
| 53 | 2-ethyl-3,3'-dimethyl-3,3'-di-n-propyl-1,1'-spirobiindan-4,5,6',7'-tetrol |
| 54 | 2-ethyl-3,3'-dimethyl-3,3'-di-n-propyl-1,1'-spirobiindan-5,6,5',6'-tetrol |
| 55 | 2-ethyl-3,3'-dimethyl-3,3'-di-n-propyl-1,1'-spirobiindan-6,7,6',7'-tetrol |

TABLE 5

| No. | Compounds |
|---|---|
| 56 | 2-ethyl-3,3'-dimethyl-3,3'-di-n-propyl-1,1'-spirobiindan-5,6,6',7'-tetrol |
| 57 | 2-ethyl-3,3'-dimethyl-3,3'-di-n-propyl-1,1'-spirobiindan-4,6,4',6'-tetrol |
| 58 | 2-ethyl-3,3'-dimethyl-3,3'-di-n-propyl-1,1'-spirobiindan-4,6,5',7'-tetrol |
| 59 | 2-ethyl-3,3'-dimethyl-3,3'-di-n-propyl-1,1'-spirobiindan-5,7,5',7'-tetrol |
| 60 | 2-ethyl-3,3'-dimethyl-3,3'-di-n-propyl-1,1'-spirobiindan-5,7,4',6'-tetrol |
| 61 | 2-n-propyl-3,3'-dimethyl-3,3'-di-n-butyl-1,1'-spirobiindan-4,5,4',5'-tetrol |
| 62 | 2-n-propyl-3,3'-dimethyl-3,3'-di-n-butyl-1,1'-spirobiindan-4,5,5',6'-tetrol |
| 63 | 2-n-propyl-3,3'-dimethyl-3,3'-di-n-butyl-1,1'-spirobiindan-4,5,6',7'-tetrol |
| 64 | 2-n-propyl-3,3'-dimethyl-3,3'-di-n-butyl-1,1'-spirobiindan-5,6,5',6'-tetrol |
| 65 | 2-n-propyl-3,3'-dimethyl-3,3'-di-n-butyl-1,1'-spirobiindan-6,7,6',7'-tetrol |
| 66 | 2-n-propyl-3,3'-dimethyl-3,3'-di-n-butyl-1,1'-spirobiindan-5,6,6',7'-tetrol |
| 67 | 2-n-propyl-3,3'-dimethyl-3,3'-di-n-butyl-1,1'-spirobiindan-4,6,4',6'-tetrol |
| 68 | 2-n-propyl-3,3'-dimethyl-3,3'-di-n-butyl-1,1'-spirobiindan-4,6,5',7'-tetrol |
| 69 | 2-n-propyl-3,3'-dimethyl-3,3'-di-n-butyl-1,1'-spirobiindan-5,7,5',7'-tetrol |
| 70 | 2-n-propyl-3,3'-dimethyl-3,3'-di-n-butyl-1,1'-spirobiindan-5,7,4',6'-tetrol |

TABLE 6

| No. | Compounds |
|---|---|
| 71 | 2-iso-propyl-3,3'-dimethyl-3,3'-di-iso-butyl-1,1'-spirobiindan-4,5,4',5'-tetrol |
| 72 | 2-iso-propyl-3,3'-dimethyl-3,3'-di-iso-butyl-1,1'-spirobiindan-4,5,5',6'-tetrol |
| 73 | 2-iso-propyl-3,3'-dimethyl-3,3'-di-iso-butyl-1,1'-spirobiindan-4,5,6',7'-tetrol |
| 74 | 2-iso-propyl-3,3'-dimethyl-3,3'-di-iso-butyl-1,1'-spirobiindan-5,6,5',6'-tetrol |
| 75 | 2-iso-propyl-3,3'-dimethyl-3,3'-di-iso-butyl-1,1'-spirobiindan-6,7,6',7'-tetrol |
| 76 | 2-iso-propyl-3,3'-dimethyl-3,3'-di-iso-butyl-1,1'-spirobiindan-5,6,6',7'-tetrol |
| 77 | 2-iso-propyl-3,3'-dimethyl-3,3'-di-iso-butyl-1,1'-spirobiindan-4,6,4',6'-tetrol |
| 78 | 2-iso-propyl-3,3'-dimethyl-3,3'-di-iso-butyl-1,1'-spirobiindan-4,6,5',7'-tetrol |
| 79 | 2-iso-propyl-3,3'-dimethyl-3,3'-di-iso-butyl-1,1'-spirobiindan-5,7,5',7'-tetrol |
| 80 | 2-iso-propyl-3,3'-dimethyl-3,3'-di-iso-butyl-1,1'-spirobiindan-5,7,4',6'-tetrol |
| 81 | 2,3,3'-trimethyl-3,3'-diethyl-1,1'-spirobiindan-5,5'-diol |
| 82 | 2,3,3'-trimethyl-3,3'-diethyl-1,1'-spirobiindan-5,6'-diol |

TABLE 7

| No. | Compounds |
|---|---|
| 83 | 2,3,3'-trimethyl-3,3'-diethyl-1,1'-spirobiindan-6,6'-diol |
| 84 | 2,2'-dimethyl-3,3,3',3'-tetraethyl-1,1'-spirobiindan-5,5'-diol |
| 85 | 2,2'-dimethyl-3,3,3',3'-tetraethyl-1,1'-spirobiindan-5,6'-diol |
| 86 | 2,2'-dimethyl-3,3,3',3'-tetraethyl-1,1'-spirobiindan-6,6'-diol |
| 87 | 5,5'-di-t-buthyl-2,3,3'-trimethyl-3,3'-diethyl-1,1'-spirobiindan-6,6'-diol |
| 88 | 5,5'-di-t-buthyl-2,2'-dimethyl-3,3,3',3'-tetraethyl-1,1'-spirobiindan-6,6'-diol |
| 89 | 7,7'-dibromo-2,3,5,3',5'-heptamethyl-3,3'-diethyl-1,1'-spirobiindan-6,6'-diol |
| 90 | 5,5'-diamino-2,2'-dimethyl-3,3,3',3'-tetraethyl-1,1'-spirobiindan-6,6'-diol |
| 91 | 3,4,4'-trimethyl-4,4'-diethyl-2,2'-spirobichroman-6,7,6'7'-tetrol |
| 92 | 7,7'-dichlor-3,4,4'-trimethyl-4,4'-diethyl-2,2'-spirobichroman-6,6'-diol |
| 93 | 5,5=-dichlor-3,4,4'-trimethyl-4,4'-diethyl-2,2'-spirobichroman-6,6'-diol |
| 94 | 6,6'-di-t-buthyl-3,4,4'-trimethyl-4,4'-diethyl-2,2'-spirobichroman-7,7'-diol |

The compound of the present invention can be obtained by normal esterification reaction of a part or all of hydroxyl groups of said polyhydroxy compound with 1,2-naphthoquinonediazide-5-(and/or -4-) sulfonyl chloride in the presence of basic catalyst. Specifically, a predetermined quantity of polyhydroxy compound and 1,2-naphthoquinondiazide-5-(and/or -4-) sulfonyl chloride as well as solvents such as dioxane, acetone, methylethylketone, N-methylpyrolidone, etc. are placed in a flask, and this is condensed by dropping basic catalyst such as sodium hydroxide, sodium carbonate, sodium hydrogencarbonate, triethylamine, etc. The resultant product is rinsed with water, purified and dried.

By the above esterification reaction, mixtures with different ester values and different esterification positions can be obtained.

As the alkali-soluble resin used in the present invention, novolak resin, vinylphenol resin, N-(hydroxyphenyl) maleimide (co)polymer, styrene-maleic acid anhydride copolymer, or metacryl or acrylic resin containing carboxyl group, sulfonyl group, or phosphonic acid group may be used.

The alkali-soluble novolak resin used in the present invention can be obtained by condensation of 1 mol of phenols and 0.6 to 2.0 mols of aldehydes in the presence of acid catalyst. As the phenols, phenol, p-chlorphenol, o-cresol, m-cresol, p-cresol, ethylphenol, resorcinol, naphthol and xylenol, etc. may be used alone or in combination. As the aldehydes, formaldehyde, paraformaldehyde, acetoaldehyde or furfural, etc. may be used. As the acid catalyst, hydrochloric acid, sulfuric acid, formic acid, oxalic acid and acetic acid may be used. The novolak resin thus obtained has molecular weight of 1,000 to 50,000 and is alkali-soluble.

The photosensitive material and the alkali-soluble novolak resin in the present invention are used in the following ratio: Novolak resin by 100 weight parts and the photosensitive material by 5 to 100 weight parts, or more preferably, by 10 to 50 weight parts. If the ratio of the latter is used by less than 5 weight parts, the ratio of (remaining) film extremely decreases. If it is used by more than 100 weight parts, sensitivity and solubility to solvents decrease.

In the present invention, the above photosensitive materials should be primarily used, whereas the following photosensitive materials may be used: For example, ester compound of 1,2-naphthoquinonediazide-5-sulfonyl chloride with polyhydroxybenzophenones such as 2,3,4-trihydroxybenzophenone, 2,4,4'-trihydroxybenzophenone, 2,4,6-trihydroxybenzophenone, 2,3,4,4'-tetrahydroxybenzophenone, 2,2',4,4'-tetrahydroxybenzophenone, 2,4,6,3', 4', 5'-hexahydroxybenzophenone, 2,3,4,3',4',5'-hexahydroxybenzophenone, etc., polyhydroxyphenylalkylketones such as 2,3,4-trihydroxyacetophenone, 2,3,4-trihydroxyphenylhexylketone, etc., bis((poly)hydroxyphenyl) alkanes such as bis(2,4-dihydroxyphenyl)methane, bis(2,3,4-trihydroxyphenyl)methane, bis(2,4-dihydroxyphenyl)propane-1, etc., polyhydroxy-benzoic acid esters such as 3,4,5-trihydroxy propyl benzoate, 3,4,5-trihydroxy phenyl benzoate, etc. bis(polyhydroxybenzoyl) alkane or bis(-polyhydroxybenzoyl)aryl such as bis(2,3,4-trihydroxybenzoyl)methane, bis(2,3,4-trihydroxybenzoyl)benzene, etc., alkylene-di-(polyhydroxybenzoate) such as ethylene glycol-di-(3,5-dihydroxybenzoate), etc. In this case, it is preferable to use the photosensitive material of the above general formula (A) by 100 weight parts and the above compound by less than 100 weight parts, or more preferably, less than 30 weight parts.

Further, in the present invention, polyhydroxy compound may be contained in order to promote dissolution in developing solution. As the preferable polyhydroxy compounds, phenols, resorcin, phloroglucin, 2,3,4-trihydroxybenzophenone, 2,3,4,4'-tetrahydroxybenzophenone, 2,3,4,3',4',5'-hexahydroxybenzophenone, acetone-pyrogallol condensed resin, etc. may be used.

As the solvents to dissolve the photosensitive materials and the alkali-soluble resin of the present invention, ketones such as methylethylketone, cyclohexanone, etc., alcohol ethers such as ethyleneglycol-monomethylether, ethyleneglycol-monoethyl ether etc. ethers such as dioxane, ethyleneglycol-dimethyl ether, diethyleneglycoldimethyl ether, etc., cellosolve esters such as methylcellosolve acetate, ethylcellosolve acetate, etc., fatty acid esters such as buthyl acetate, ethyl lactate, methyl lactate, etc., halogenated hydrocarbons such as 1,1,2-trichloroethylene, etc. or high polar solvents such as dimethylacetoamide, N-methylpyrolidone, dimethylformamide, dimethylsulfoxide, γ-butylolactone, etc. may be used. These solvents may be used alone or in combination.

To the composition for photoresist of the present invention, dyes, plasticizers, supplementary bonding agents, surface active agents, etc. may be blended. More concretely, the dyes such as methyl violet, crystal violet, malachite green, etc., the plasticizers such as stearic acid, actal resin, phenoxy resin, alkyd resin, etc., supplementary bonding agent such as hexamethyldisilazane, chloromethylsilane, etc., and the surface active agents such as nonylphenoxy-poly-(ethyleneoxy)ethanol, octylphenoxy-poly-(ethyleneoxy)ethanol, etc. may be used. Also, the compounds described in Japanese Patent Publication Laid-Open 58-149042 or Japanese Patent Publication Laid-Open 58-182633 may be added.

When the above photoresist composition is coated on a substrate (e.g. silicon/silicon dioxide film) used in the manufacture of precision integrated circuit by adequate coating method such as spinner, coater, etc. and it is further exposed to light through a predetermined mask and developed, satisfactory resist can be obtained.

As the developing solution for the photoresist composition of the invention, aqueoous solution of the following substances may be used: inorganic alkalis, such as sodium hydroxide, potassium hydroxide, sodium carbonate, sodium silicate, sodium metasilicate, aqueous ammonia, etc., primary amines such as ethylamine, n-propylamine, etc., secondary amines such as diethylamine, di-n-butylamine, tertiary amines such as triethylamine, methyldiethylamine, etc., alcoholamine, such as dimethylethanol amine, triethanol amine, etc., quaternary ammonium salts such as tetramethylammonium hydroxide, tetraethylammonium hydroxide, choline hydroxide, etc. or alkalis of cyclic amines such as pyrrole, piperidine, etc. Further, adequate quantity of alcohols or surface active agents may be added to aqueous solution of the above alkalis.

When necessary, image reversal treatment may be performed on the photosensitive resin composition of the present invention by the methods described in British Patent 844,039, U.S. Pat. No. 4,104,070 or Japanese Patent Publication 55-32088, and negative image can be obtained.

In the following, description will be given on embodiments of the present invention, while the present invention is not limited to such embodiments. The symbol "%" means weight % unless otherwise specified.

First, description will be given on synthesis of the photosensitive materials and novolak resin.

(1) Synthesis of Photosensitive Material (a)

Into a three-neck flask, 1513.3 g of pyrogallol, 2800 ml of acetic acid, and 2400 ml of conc. hydrochloric acid were placed, and the mixture was uniformly dissolved while stirring. It was heated in a water bath, and 1297.9 g of methylethylketone were dropped over a period of 6 hours 40 minutes. After heating and stirring in a water bath for 80 minutes, it was cooled down to room temperature. After cooling, the precipitates were filtered, rinsed with 10 liters of distilled water and was dried under reduced pressure.

Into a three-neck flask, 22.0 g of isomer mixture thus obtained and represented by 2,3,3'-trimethyl-3,3'-diethyl-1,1'-spirobiindan-5,6,7,5',6',7'-hexol, 80.6 g of 1,2-naphthoquinonediazide-5-sulfonyl chloride, and 750 ml of acetone were placed, and these were uniformly dissolved while stirring. Then, 32.5 g of triethylamine were gradually dropped, and this was allowed to react for 2 hours 30 minutes at room temperature. After the reaction was completed, the content was dropped into 2.5% aqueous solution of acetic acid. The resultant precipitates were filtered and dried under reduced pressure, and the photosensitive material (a) was obtained.

(2) Synthesis of the Photosensitive Material (b)

Using pyrogallol and diethylketone, isomer mixture represented by 2,2'-dimethyl-3,3,3',3'-tetraethyl-1,1'-spirobiindan-5,6,7,5',6',7'-hexol was prepared by the same procedure as the photosensitive material (a).

Into a three-neck flask, 24.5 g of the isomer mixture represented by 2,2'-dimethyl-3,3,3',3'-tetraethyl-1,1'-spirobiindan-5,6,7,5',6',7'-hexol obtained above, 80.6 g of 1,2-naphthoquinonediazide-5-sulfonyl chloride and 750 ml of acetone were placed, and this mixture was uniformly dissolved while stirring. Then, 32.5 g of triethylamine was gradually dropped and this was allowed to react at room temperature for 2 hours 30 minutes. After the reaction was completed, the content was dropped into 2.5% aqueous solution of acetic acid. The resultant precipitates were filtered and dried under reduced pressure, and the photosensitive material (b) was obtained.

(3) Synthesis of the Photosensitive Material (c)

Using 1,2,4-triacetoxybenzene and methylethylketone, 3,4,4'-trimethyl-4,4'-diethyl-2,2'-spirobichroman-6,7,6',7'-tetrol was obtained by the same procedure as the photosensitive material (a).

Then, 22.0 g of 3,4,4'-trimethyl-4,4'-diethyl-2,2'-spirobichroman-6,7,6',7'-tetrol, 80.6 g of 1,2-naphthoquinonediazide-5-sulfonyl chloride, and 750 ml of were placed into a three-neck flask, and the mixture was uniformly dissolved while stirring. Next, 32.5 g of triethylamine were gradually dropped and were allowed to react at room temperature for 2 hours 30 minutes. After the reaction was completed, the content was dropped into 2.5% aqueous solution of acetic acid. The resultant precipitates were filtered and dried under reduced pressure, and the photosensitive material (c) was prepared.

(4) Synthesis of Novolak Resin

Into a three-neck flask, 45 g of metacresol, 55 g of paracresol, 54.0 g of 37% formalin aqueous solution, and 0.05 g of oxalic acid were placed. This was heated up to 115° C. while stirring and was refluxed for 15 hours. Then, the bath temperature was gradually increased to 230° C., and water was distilled away. Further, the pressure was reduced to 2 mmHg, and the remaining monomer was removed. The novolak resin thus obtained has average molecular weight of 6,600 (converted to polystyrene).

EXAMPLE 1

0.51 g of the photosensitive material (a) synthesized in (1) above and 2.01 g of novolak resin synthesized in (4) above were dissolved in 7.50 g of ethoxyethyl acetate, and the resultant mixture was filtered through 0.2 $\mu$m microfilter, and a resist composition was prepared.

This resist composition was coated on a silicon wafer using spinner. This was dried on a vacuum adsorption type hot plate at 90° C. for 60 seconds, and a resist film with thickness of 1.2 $\mu$m was obtained. Next, using a Nikon reduction projection aligner (exposure system) (g-ray; numerical aperture: 0.48), exposure to light was performed through a test chart mask.

The wafer thus exposed was heated on a hot plate at 120° C. for 60 seconds, and development was performed for one minute in aqueous solution of tetramethylammonium hydroxide of 2.38 weight %. Then, it was rinsed with ion exchange water and a resist pattern was obtained.

The resist pattern thus obtained was examined under scanning electron microscope. The sensitivity was defined by a reciprocal of the exposure to reproduce a mask pattern of 0.7 $\mu$m and was expressed by the relative value to the sensitivity of the comparative example described below. Remaining film ratio was expressed by percentage of film thickness of non-exposed portion after development to the thickness before development.

To determine heat-resistance, a silicon wafer having a resist pattern was baked for 4 minutes on a vacuum adsorption hot plate at a predetermined temperature, and heat resistance was expressed by the temperature value, at which the resist patterns began to deform.

Resolution was expressed by linewidth of the smallest mask pattern resolved in the exposure to reproduce a mask pattern of 0.7 $\mu$m.

Sidewall angle was expressed by an angle between the substrate and side wall of the resist pattern when cross-section of the resist pattern of 0.7 $\mu$m was examined from lateral direction under electron microscope.

The relative sensitivity was 1.05, remaining film ratio was 99.7%, heat resistance was 150° C., resolution was 0.45 $\mu$m, and sidewall angle was 89 degrees.

EXAMPLES 2–4

The photosensitive materials synthesized in (2) and (3) above were used at the ratio shown in Table 8 below, and resist compositions were prepared by the same procedure as in Example 1 and were evaluated. The results are given in Table 9.

TABLE 8

| Examples | Photosensitive materials | | Novolak resin | Solvents |
|---|---|---|---|---|
| Example 2 | Photosensitive material (a) | 0.49 g | 1.99 g | Ethyl lactate 7.49 g |
| Example 3 | Photosensitive material (b) | 0.50 g | 2.00 g | Same as Example 1 7.50 g |
| Example 4 | Photosensitive material (c) | 0.49 g | 1.98 g | Same as Example 1 7.48 g |

TABLE 9

| Examples | Relative sensitivity | Resolution | Remaining film ratio | Heat-resistance | Sidewall angle |
|---|---|---|---|---|---|
| Example 2 | 1.1 | 0.45 | 99.6 | 150° C. | 89° |
| Example 3 | 1.0 | 0.47 | 99.8 | 145° C. | 89° |
| Example 4 | 1.05 | 0.45 | 99.7 | 150° C. | 89° |

As it is evident from the above results, the photoresist of the present invention has excellent sensitivity, high resolution, remaining film ratio and heat resistance, and sidewall angle of pattern exceeded 88 degrees in all cases.

Comparative Examples 1–3

Using the photosensitive materials, cresol novolak resin and solvents shown in Table 10 below, resist solution was prepared by the same procedure as in Example 1 and was evaluated. The results are given in Table 11.

TABLE 10

| Comparative example | Photosensitive materials | | Resin | Solvents |
|---|---|---|---|---|
| Comparative example 1 | 1,2-naphthoquinone-diazide-5-sulfonic acid ester of 3,3,3'3'-tetramethyl-1,1'-spiro-biindan-5,6,7,5',6',7'-hexol | 0.50 g | Same as Example 1 1.99 g | Same as Example 1 7.48 g |
| Comparative example 2 | 1,2-naphthoquinone-diazide-5-sulfonic acid ester of 2,3,4,4'-tetra-hydroxybenzophenone | 0.50 g | Same as Example 1 2.01 g | Ethyl lactate 7.51 g |

TABLE 10-continued

| Comparative example | Photosensitive materials | | Resin | Solvents |
|---|---|---|---|---|
| Comparative example 3 | 1,2-naphthoquinone-diazide-5-sulfonic acid ester of 4,4,4',4'-tetramethyl-2,2'-spiro-bichroman-6,7,6',7'-tetrol | 0.50 g | Same as Example 1 2.00 g | Same as Example 1 7.50 g |

TABLE 11

| Comparative example | Relative sensitivity | Resolution | Remaining film ratio | Heat-resistance | Side-wall angle |
|---|---|---|---|---|---|
| Comparative example 1 | 1.0 | 0.47 | 99.5 | 150° C. | 87° |
| Comparative example 2 | 0.8 | 0.50 | 98.9 | 140° C. | 86° |
| Comparative example 3 | 0.9 | 0.47 | 99.0 | 145° C. | 87° |

In none of the comparative examples, sidewall angle exceeded 88 degrees.

What we claim is:

1. A photosensitive resin composition, comprising an admixture of (a) 5 to 100 weight parts of a photosensitive material having the following general formula (A):

General formula (A)

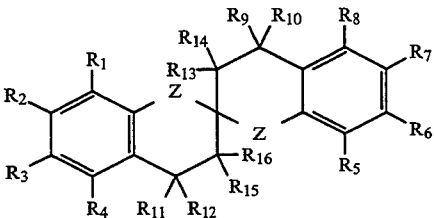

where $R_1$ to $R_8$ each independently represents a hydrogen atom, a hydroxyl group, a halogen atom, an alkyl group, an alkoxyl group, a aralkyl group, an aryl group, an amino group, a monoalkylamino group, a dialkylamino group, an acylamino group, an alkylcarbamoyl group, an arylcarbamoyl group, an alkylsulfamoyl group, an arylsulfamoyl group, a carboxyl group, a cyano group, a nitro group, an acyl group, an alkyloxycarbonyl group, an aryloxycarbonyl group, an acyloxy group, or —OD, —N(R)—D where R represents a hydrogen atom or an alkyl group, and D represents a 1,2-napthoquinoediazide-5-sulfonyl group or a 1,2-napthoquinonediazide-4-sulfonyl group, and at least one of $R_1$ to $R_8$ represents —OD or —N(R)—D;

$R_9$ to $R_{12}$ each independently represents a hydrogen atom, a lower alkyl group, or $R_9$ and $R_{10}$ and/or $R_{11}$ and $R_{12}$ may form a ring;

$R_{13}$ to $R_{14}$ each independently represents hydrogen atom, a lower alkyl group, or $R_{13}$ or $R_{14}$ and any of $R_{15}$ or $R_{16}$ may form a ring, whereas at least one of $R_{13}$ to $R_{16}$ is a substituent other than hydrogen; and Z represents an oxygen atom or a single bond, and (b) 100 weight parts of an alkali-soluble resin.

* * * * *